US008901527B2

(12) United States Patent
Hsieh et al.

(10) Patent No.: US 8,901,527 B2
(45) Date of Patent: Dec. 2, 2014

(54) RESISTIVE RANDOM ACCESS MEMORY STRUCTURE WITH TRI-LAYER RESISTIVE STACK

(75) Inventors: Chun-I Hsieh, Taoyuan County (TW); Chang-Rong Wu, Taipei County (TW); Neng-Tai Shih, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 300 days.

(21) Appl. No.: 12/829,392

(22) Filed: Jul. 2, 2010

(65) Prior Publication Data

US 2012/0001141 A1    Jan. 5, 2012

(51) Int. Cl.
*H01L 29/02* (2006.01)
*H01L 45/00* (2006.01)

(52) U.S. Cl.
CPC ............ *H01L 45/08* (2013.01); *H01L 45/1641* (2013.01)
USPC ................ 257/2; 257/3; 257/4; 257/E21.004; 257/E45.001

(58) Field of Classification Search
USPC ........................ 257/2, 3, 4, E21.004, E45.001
See application file for complete search history.

(56) References Cited

U.S. PATENT DOCUMENTS

| | | | |
|---|---|---|---|
| 6,927,120 B2 | 8/2005 | Hsu | |
| 8,097,537 B2 * | 1/2012 | Quick et al. | 438/652 |
| 2007/0051998 A1 | 3/2007 | Kil | |
| 2007/0176264 A1* | 8/2007 | Lee et al. | 257/614 |
| 2010/0163819 A1* | 7/2010 | Hwang | 257/2 |

FOREIGN PATENT DOCUMENTS

| | | |
|---|---|---|
| CN | 101030623 A | 9/2007 |
| CN | 101621115 A | 1/2010 |

OTHER PUBLICATIONS

Tzu-Ning Fang, Swaroop Kaza, Sameer Haddad, An Chen, Yi-Ching (Jean) Wu, Zhida Lan, Steven Avanzino, Dongxiang Liao, Chakku Gopalan, Seungmoo Choi, Sara Mahdavi, Matthew Buynoski, Yvonne Lin, Christie Marrian, Colin Bill, Michael Vanbuskirk and Masao Taguchi, Erase Mechanism for Copper Oxide Resistive Switching Memory Cells with Nickel Electrode, IEEE, 2006.
Kentaro Kinoshita, Tetsuro Tamura, Masaki Aoki, Yoshihiro Sugiyama and Hitoshi Tanaka, Lowering the Switching Current of Resistance Random Access Memory Using a Hetero Junction Structure Consisting of Transition Metal Oxides, Japanese Journal of Applied Physics, vol. 45, No. 37, 2006, pp. L991-L994.
K. Aratani, K. Ohba, T. Mizuguchi, S. Yasuda, T. Shiimoto, T. Tsushima, T. Sone, K. Endo, A. Kouchiyama, S. Sasaki, a. Maesaka, N. Yamada, and H. Narisawa, A Novel Resistance Memory with High Scalability and Nanosecond Switching, IEEE, 2007, pp. 783-786.
"Semiconductor Manufacturing Technology," By Michael Quirk, Julian Serda, Prentice-Hall, Inc., 2001, p. 230.
"Introduction to Semiconductor Manufacturing Technology," by Hong Xiao, Prentice-Hall, Inc., 2001, p. 309.

* cited by examiner

*Primary Examiner* — Andy Huynh
(74) *Attorney, Agent, or Firm* — Winston Hsu; Scott Margo

(57) ABSTRACT

An RRAM includes a resistive layer including a dielectric layer and surplus oxygen ions or nitrogen ions from a treatment on the dielectric layer after the dielectric layer is formed. When the RRAM is applied with a voltage, the oxygen ions or nitrogen ions occupy vacancies in the dielectric layer to increase resistance of the resistive layer. When the RRAM is applied with another voltage, the oxygen ions or nitrogen ions are removed from the vacancies to lower the resistance of the resistive layer.

6 Claims, 7 Drawing Sheets

RESISTIVE RANDOM ACCESS MEMORY STRUCTURE WITH TRI-LAYER RESISTIVE STACK

BACKGROUND OF THE INVENTION

1. Field of the Invention

The present invention relates to a memory, and particularly to an RRAM structure and a method of making the same.

2. Description of the Prior Art

Resistive random access memory (RRAM) is a new memory structure created in the semi-conductive field. An RRAM stores data by using the variable resistance characteristic of a dielectric layer interposed between two electrodes. Such dielectric layer, as a resistive layer, is normally insulating but can be made to be conductive through a filament or conduction path formed after application of a sufficiently high voltage, i.e. through a forming process. The conduction path formation can arise from different mechanisms, including defects, metal migration, etc. Once the filament is formed, it may be reset (i.e. broken, resulting in high resistance) or set (i.e. re-formed, resulting in lower resistance) by an appropriately applied voltage.

FIGS. 1 and 2 show a schematic cross-sectional view of a conventional RRAM at a low resistance status and a high resistance status, respectively. As shown in FIGS. 1 and 2, an RRAM 10 includes a bottom electrode 12, a resistive layer 14 and a top electrode 20. A forming process has been performed on the RRAM 10, during which a gradually increasing voltage is applied to the top electrode 20 and the bottom electrode 12, and then the current flowing through the bottom electrode 12, the resistive layer 14 and the top electrode 20 is raised to a compliance current. In this way, the quality of the resistive layer 14 becomes non-uniform and the upper part of the resistive layer 14 will have fewer defects than the lower part of the resistive layer 14. When the RRAM is working upon application of a voltage, current filament 22 occurs in the resistive layer 14. As shown in FIG. 1, the current filament 22 distributes from the bottom electrode 12 to the top electrode 20 to make the RRAM 10 have a low resistance. As shown in FIG. 2, the current filament 22 is broken at the upper portion of the resistive layer 14 to make the RRAM 10 have a high resistance.

The forming process mentioned above is highly complicated and time-consuming. Furthermore, the forming process is performed electrically through a random way, in which breakdown is easily out of control, resulting in low yield.

Therefore, there is still a need for a novel RRAM which can be made easily and has an excellent performance.

SUMMARY OF THE INVENTION

An object of the present invention is to provide an RRAM structure not requiring a time-consuming forming process and the resistance variation is easily controlled.

Another object of the present invention is to provide a method of making the RRAM structure as mentioned above.

The RRAM structure according to an embodiment of the present invention comprises a bottom electrode, a top electrode and a resistive layer. The resistive layer is sandwiched between the bottom electrode and the top electrode. The resistive layer comprises a dielectric layer formed of a dielectric material with a plurality of vacancies as being structural defects. The resistive layer further comprises oxygen ions or nitrogen ions from a treatment on the dielectric layer after the dielectric layer is formed. When the RRAM is applied with a voltage, the oxygen ions or nitrogen ions occupy the vacancies to increase resistance of the resistive layer. When the RRAM is applied with another voltage of opposite polarity, the oxygen ions or nitrogen ions are removed from the vacancies to lower the resistance of the resistive layer.

The method of forming an RRAM structure according to an embodiment of the present invention comprises steps as follows. A bottom electrode is formed. A dielectric layer is formed on the bottom electrode. An oxygen treatment or a nitrogen treatment is performed on the dielectric layer to introduce oxygen or nitrogen ions into the dielectric layer. A top electrode is performed on the dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
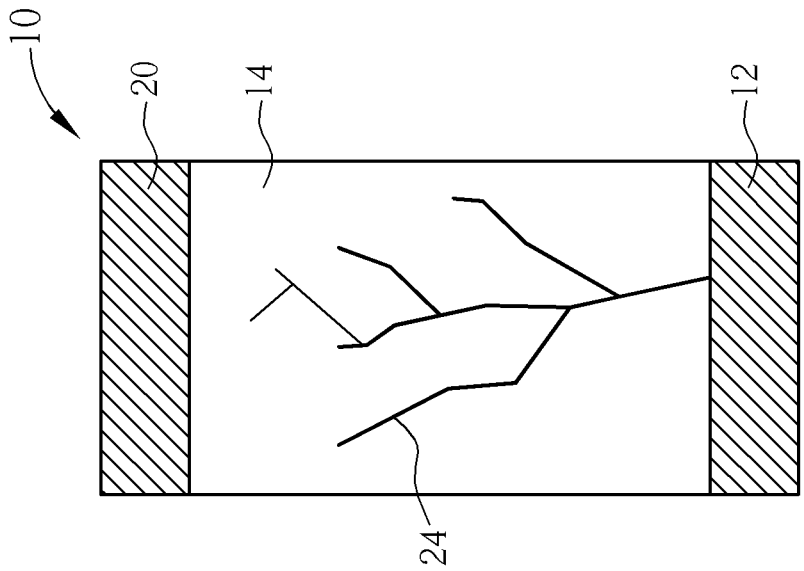
FIGS. 1 and 2 show a schematic cross-sectional view of a conventional RRAM structure at a low resistance status and a high resistance status, respectively.
Figure 1:
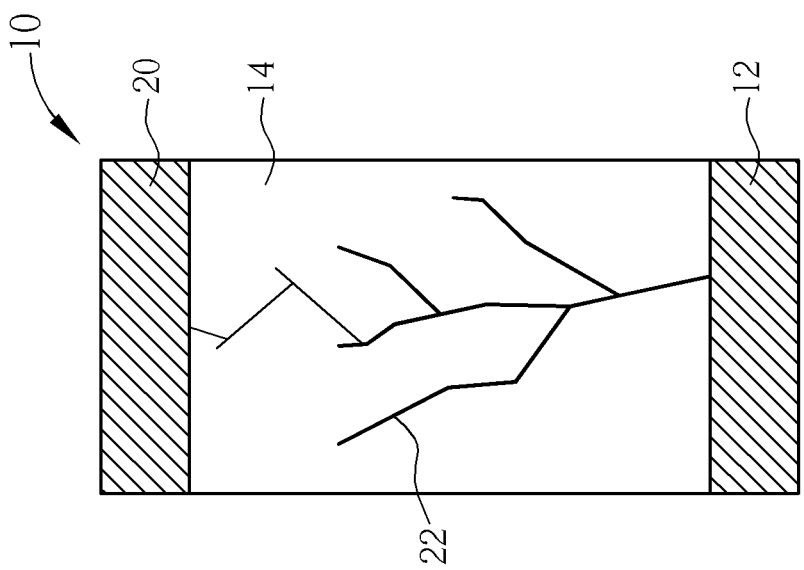
Figure 3:
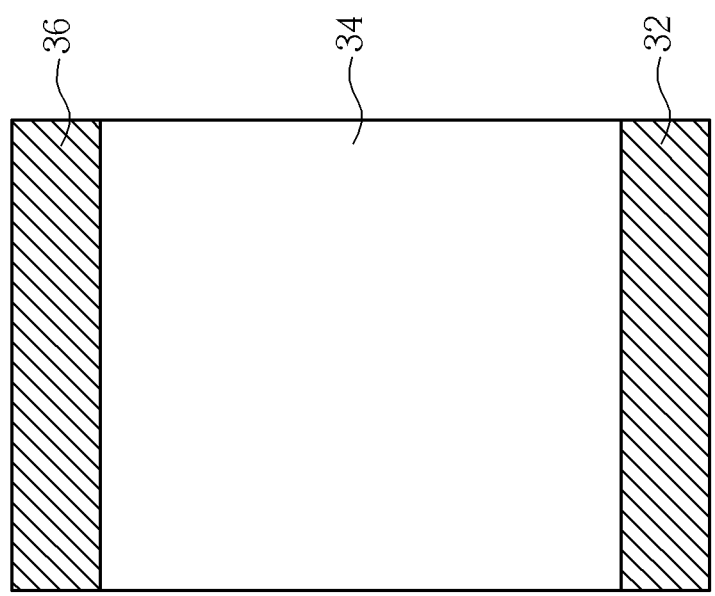
FIG. 3 shows a schematic cross-sectional view of an RRAM structure according to an embodiment of the present invention.

FIG. 3 shows a schematic cross-sectional view of an RRAM structure according to an embodiment of the present invention. An RRAM 30 includes a bottom electrode 32, a top electrode 36, and a resistive layer 34 interposed or sandwiched between the bottom electrode 32 and the top electrode 36. The resistive layer 34 includes a dielectric layer formed of a dielectric material with a plurality of vacancies as being structural defects. The resistive layer 34 further comprises oxygen ions or nitrogen ions from a treatment after the dielectric layer is formed.

The structural defects commonly occur when a material is formed in bulk. In conventional RRAM, such structural defects are utilized to form current filaments for variation of resistance upon application of a voltage after the RRAM is completely formed through a forming process. In the present invention, additional oxygen or nitrogen ions are further placed into the dielectric material. When a positive voltage, for example, 2 to 5 volts incase the oxide layer is titanium oxide with a thickness of about 30 nm, is applied to the RRAM, the oxygen or nitrogen ions occupy vacancies (the structural defects of the dielectric material), resulting in a high resistance, and when a negative voltage, for example −2 to −5 volts, is applied to the RRAM, the oxygen or nitrogen ions are removed form the vacancies, resulting in a lower resistance.

The bottom electrode and the top electrode of the present invention each may be one usually used in conventional RRAM, for example metal nitride (such as TiN), Pt, AlCu, Au, Ti, Ta, TaN, W, WN, Cu and the like, but not limited thereto.

The dielectric layer may comprise for example oxide material, such as an oxide compound of metal, such as an oxide compound of nickel, titanium, hafnium, aluminum, zirconium, zinc, tungsten, aluminum, tantalum, molybdenum, copper or the like, or an oxide compound of silicon, or nitride material such as silicon nitride. Theoretically, any oxide in solid state with vacancies can serve as the dielectric layer in the present invention.

The thickness of the dielectric layer depends on the desired design of RRAM, and is preferably more than 5 nm, and more preferably 30 to 60 nm. The oxygen ion may be $O^{2-}$. The nitrogen ion may be $N^{3-}$. The amount of oxygen or nitrogen ions additionally introduced into the dielectric layer may be for example in a range from 20% to 40% of the amount of the oxygen or nitrogen of the dielectric material. It may be preferred that the amount of additional oxygen or nitrogen ions is greater than the amount of vacancies of the dielectric material.

In one embodiment, the dielectric layer may be a $TiO_x$ layer. The symbol, x, may be preferably a number in a range from 1.5 to 2. The $TiO_x$ layer, which may be amorphous or crystalline, has vacancies, as a generally formed dielectric layer does. The introduced oxygen or nitrogen ions occupy the vacancies.

Figure 5:
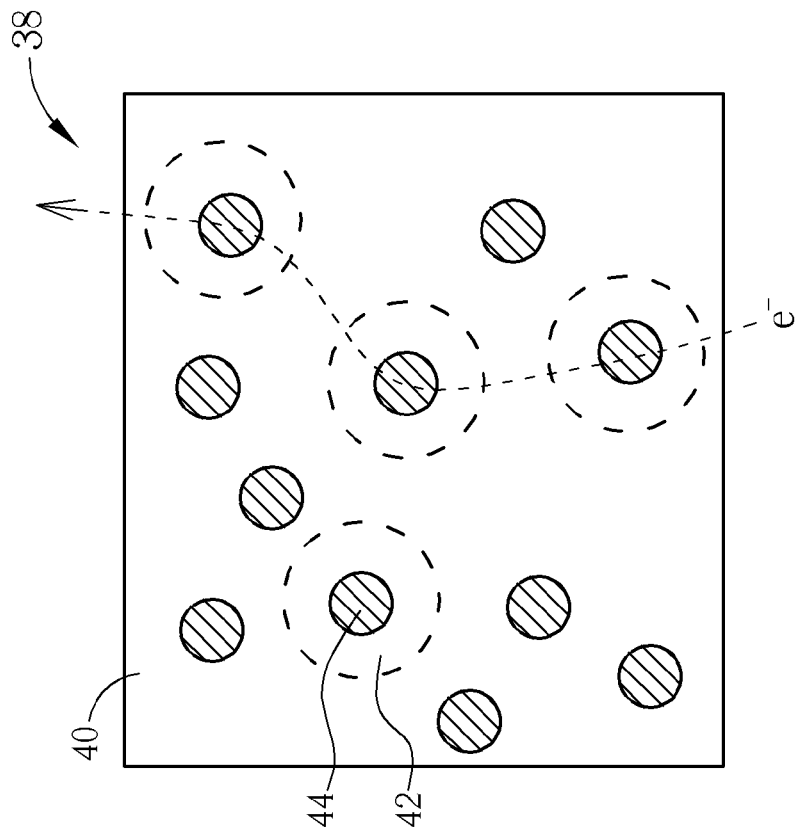
FIGS. 4 and 5 schematically show a dielectric layer of an RRAM structure according to an embodiment of the present invention at a low resistance status and a high resistance status, respectively.
Figure 4:
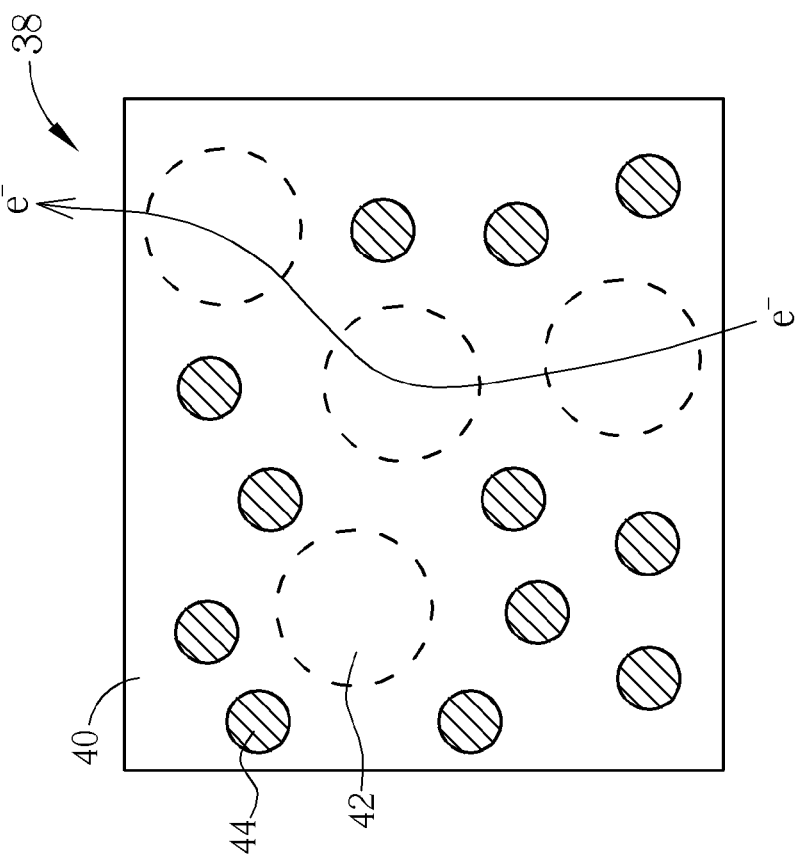

FIGS. 4 and 5 schematically show a resistive layer of an RRAM according to an embodiment of the present invention at a low resistance status and a high resistance status, respectively. The resistive layer 38 comprises a dielectric material 40 with a plurality of vacancies 42 and further a plurality of oxygen or nitrogen ions 44. In FIG. 4, the vacancies are not occupied, and electrons can flow via the vacancies, and thus the RRAM has a low resistance. In FIG. 5, the vacancies 42 are occupied by the ions 44, and electrons can not flow via the vacancies 42, and thus the RRAM has a high resistance.

Figure 6:
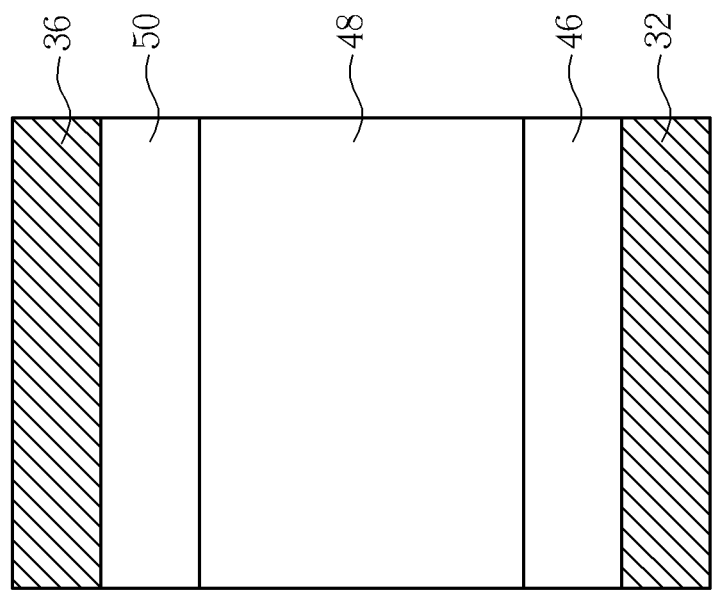
FIG. 6 shows an RRAM structure according to an embodiment of the present invention.

The dielectric layer may be a single layer or a multi-layer. When it is a multi-layer, it is preferred that the additional oxygen or nitrogen ions are placed in the layer beneath the top layer. The material of each layer of the multi-layer may be the same or different. FIG. 6 shows an embodiment in which the dielectric layer is formed of three layers, 46, 48, and 50. The dielectric layer 46 and the dielectric layer 50 are thinner than the dielectric layer 48. For example, the thickness of the dielectric layers 46, 48, 50 may be less than 10 nm, between 40 and 10 nm, and less than 10 nm, respectively. The dielectric layer 46 may serve as a barrier layer to block the diffusion of the oxygen or nitrogen ions to the bottom electrode 32, thereby preventing the oxygen or nitrogen ions from reacting with the bottom electrode. The dielectric layer 50 can serve as a sacrificial layer or a screen layer to protect the dielectric layer 48 from being damaged by the impact of the ion implants, alleviate channel effect and also serve as a barrier layer to prevent the oxygen or nitrogen ions from reacting with the top electrode.

The RRAM structure according to the present invention may be made through steps as follows. A bottom electrode is formed by, for example, a sputtering process or an atomic layer deposition (ALD) process. A dielectric layer is formed on the bottom electrode by, for example, physical vapor deposition (PVD), chemical vapor deposition (CVD) process, atomic layer deposition (ALD), or metal sputtering followed by an oxidation, such as usually formed in a conventional technique. Thereafter, an oxygen treatment or a nitrogen treatment is further performed on the dielectric layer to introduce oxygen or nitrogen ions into the dielectric layer. Thereafter, a top electrode is formed on the dielectric layer, which may be performed in the same way as the bottom layer.

The oxygen or nitrogen ions may be introduced into the dielectric layer through a treatment on the dielectric layer. Preferably, when the dielectric layer is formed of oxide material to be an oxide layer, additional oxygen ions are introduced into the oxide layer, and when the dielectric layer is formed of nitride material to be a nitride layer, additional nitrogen ions are introduced into the nitride layer. The oxygen treatment or the nitrogen treatment may be an ion implantation process or a plasma drive-in treatment.

Figure 7:
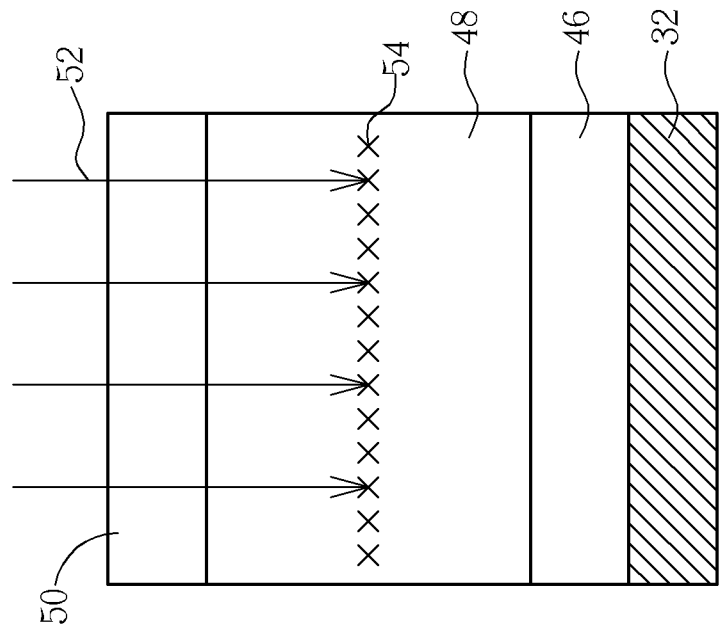
FIG. 7 illustrates a method of forming an RRAM structure according to an embodiment of the present invention.

The ion implantation is preferably performed to implant the oxygen or nitrogen ions into the dielectric layer at the middle height of the dielectric layer, particularly when the dielectric layer of the RRAM is single-layered, for preventing the implanted ions from reacting with the top or bottom electrode, but not limited thereto. FIG. 7 shows after the dielectric layers 46, 48, and 50 are formed, an ion implantation 52 is performed to implant oxygen or nitrogen ions 54 through the sacrificial dielectric layer 50 and into the dielectric layer 48, preferably at a half depth of the dielectric layer 48. For example, when the dielectric layer 48 is a titanium oxide layer with a thickness of about 15 nm, the oxygen ion implantation may be performed with energy of 10 to 25 KeV and a dose of $5 \times 10^{15}$ to $5 \times 10^{16}$ atoms/cm$^2$, using for example $O_2$ or CO as an ion source. The implanted ions may distribute in the dielectric layer as a Gaussian distribution. Thermal treatment may be not required after the implantation.

Figure 8:
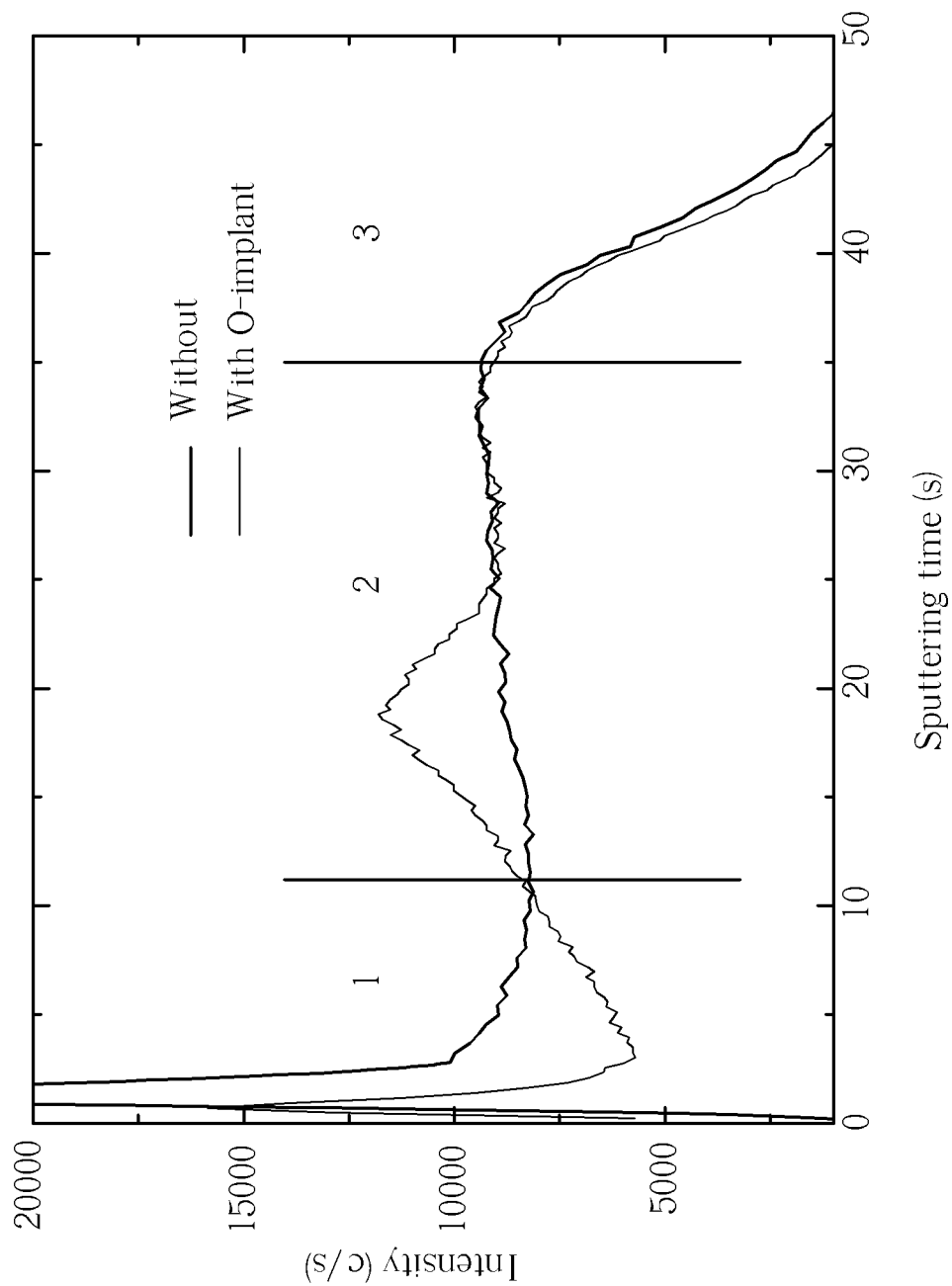
FIG. 8 shows results of concentration distribution of oxygen determined by secondary ion mass spectrometry (SIMS)

FIG. 8 shows a result of a concentration distribution of the oxygen, determined by SIMS, of the three oxide layers of the RRAM according to the embodiment of the present invention as referred to FIG. 7, in which the three dielectric layers 50, 48, 46 are titanium oxide and labeled as 1, 2, and 3, respectively. A result of a concentration distribution of the oxygen of three titanium oxide layers without additional oxygen introduction is also shown for purpose of comparison. The oxide layer 2 (the dielectric layer 48) has the highest oxygen content among the three oxide layers. The oxide layer 1 (the dielectric layer 50) may contain additional oxygen ions. The oxide layer 3 (the dielectric layer 46) contains less additional oxygen ions.

Figure 9:
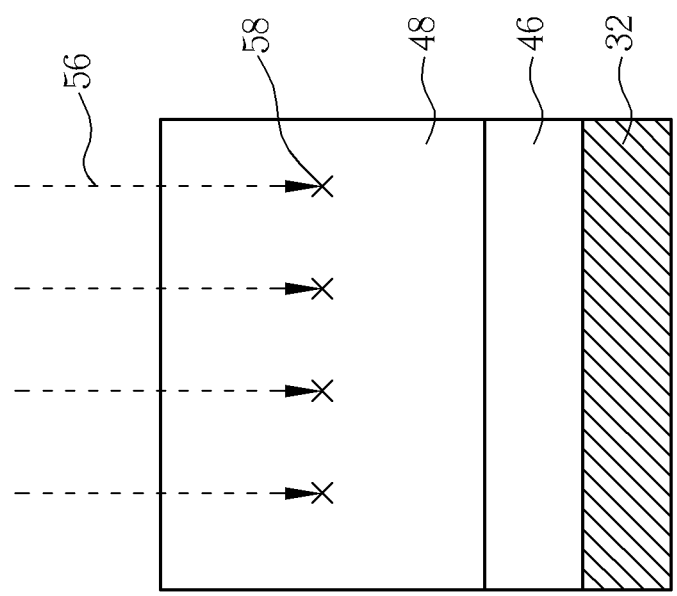
FIG. 9 illustrates a method of forming an RRAM structure according to another embodiment of the present invention.

The plasma drive-in treatment is preferably performed to place the oxygen or nitrogen ions into the dielectric layer. FIG. 9 shows that, after the dielectric layers 46, 48 are formed, a plasma drive-in treatment 56 is performed to dispose a layer of oxygen or nitrogen ions 58 into the dielectric layer 48. Then, a thermal treatment may be optionally performed to drive the oxygen or nitrogen ions into the deeper portion of the dielectric layer 48. A buffer or oxygen blocking/barrier layer on the top of the dielectric layer 48 may be utilized in this embodiment.

Figure 10:
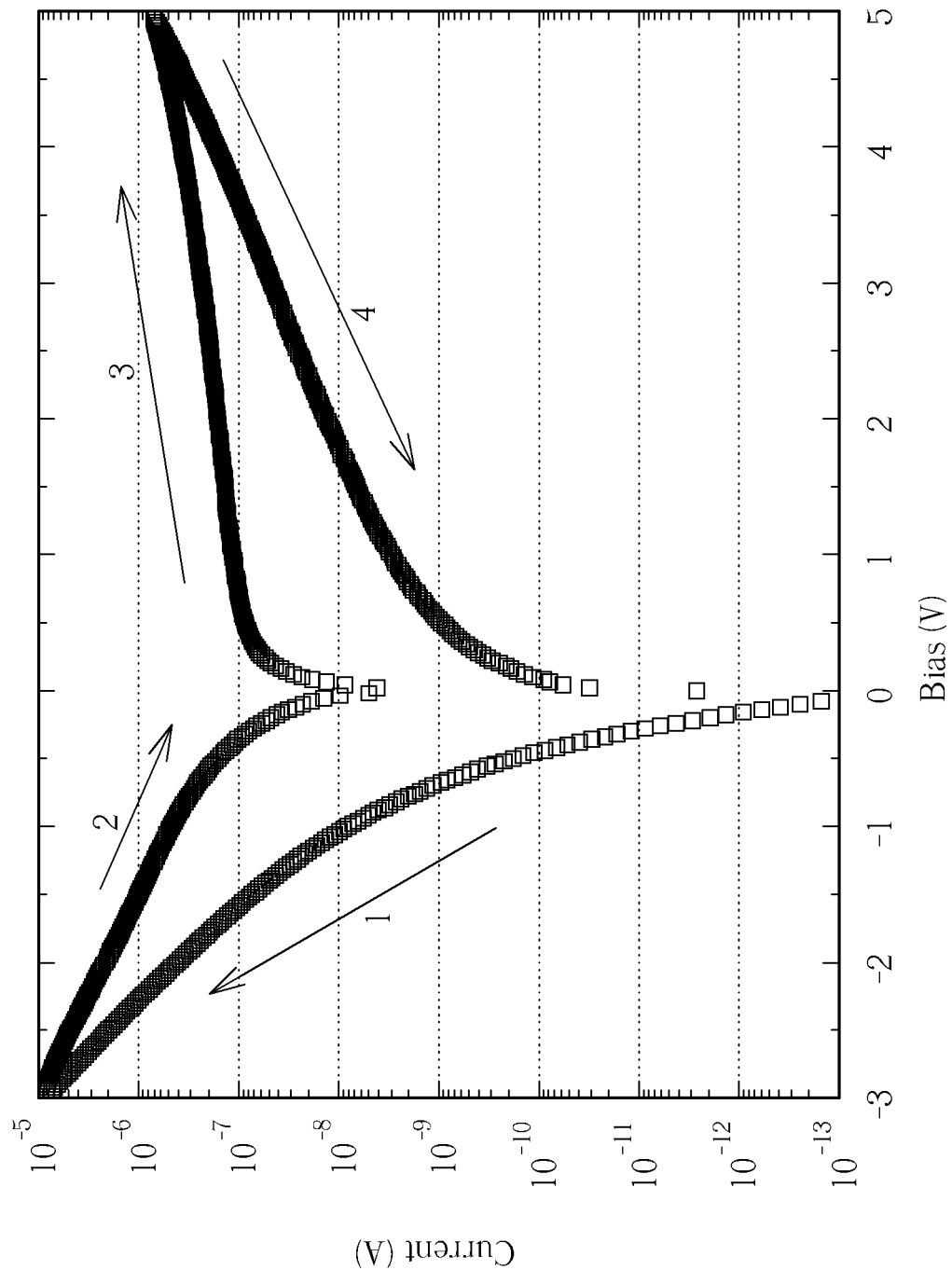
FIG. 10 shows a plot of current versus bias resulted from a measurement of an RRAM according to an embodiment of the present invention.

FIG. 10 shows a plot of current versus bias resulted from a measurement of an RRAM according to an embodiment of the present invention. The tested sample is an RRAM having a resistive layer structuring TiN/TiO$_{1.5}$/TiN in thickness of 10 nm/50 nm/10 nm and oxygen ions implanted within the TiO$_{1.5}$ using an energy of 15 KeV and a dose of $5 \times 10^{15}$ atoms/cm$^2$. It shows a low program current density 28 mA/cm$^2$ (area: 50 μm×50 μm, current: 7 μA) and a low erase current density 4 mA/cm$^2$ (area: 50 μm×50 μm, current: 1 μA). Furthermore, the retention time of the sample is determined to pass $10^4$ seconds at 125° C. The uniformity is better, since the yield is substantially 100% as compared to non-implanted conventional one of 48%. The RRAM of the present invention may also serve as a multi level cell (MLC), since it seems capable of more than 4 resistance states. It is endurable since the endurance test achieves $10^6$ cycles.

The RRAM according to an embodiment of the present invention has properties of resistance switching based upon occupation of vacancies by oxygen or nitrogen ions. No vacancy movement or creation occurs during the occupation of vacancies, and thus no damage occurs to the dielectric layer. Accordingly, the effective thickness of the dielectric layer will be substantially not changed. As a result, a time-consuming forming process is not required and the resistance switching can be quick and easily controlled.

Those skilled in the art will readily observe that numerous modifications and alterations of the device and method may be made while retaining the teachings of the invention.

What is claimed is:

1. A resistive random-access memory (RRAM) structure, comprising:
    a bottom electrode;
    a top electrode; and
    a tri-layer resistive stack having a first surface and a second surface which are parallel with each other and sandwiched between the bottom electrode and the top electrode, wherein the tri-layer resistive stack comprises a dielectric middle layer, a dielectric screen layer between the dielectric middle layer and the top electrode, and a dielectric barrier layer between the dielectric middle layer and the bottom electrode, wherein said first surface is in direct contact with said top electrode and said second surface is in direct contact with said bottom electrode so that the dielectric barrier layer is disposed between the top electrode and the bottom electrode, and said dielectric middle layer further comprises oxygen ions or nitrogen ions from a treatment on the tri-layer resistive stack after the tri-layer resistive stack is formed, said dielectric screen layer and said dielectric barrier layer respectively block the diffusion of said oxygen ions or nitrogen ions to said top electrode and said bottom electrode.

2. The RRAM structure according to claim 1, wherein the dielectric screen layer and the barrier layer are thinner than the middle layer.

3. The RRAM structure according to claim 1, wherein the dielectric screen layer and the dielectric barrier layer are made of a material that is different from the dielectric middle layer.

4. The RRAM structure according to claim 1, wherein ions are disposed at a half depth of the dielectric middle layer.

5. The RRAM structure according to claim 4, wherein the dielectric middle layer is a nitride layer and the ions are nitride ions.

6. The RRAM structure according to claim 1, wherein the dielectric barrier layer and the dielectric screen layer are thinner than the dielectric middle layer.

* * * * *